(12) United States Patent
Choi

(10) Patent No.: US 7,948,785 B2
(45) Date of Patent: May 24, 2011

(54) SEMICONDUCTOR DEVICES HAVING SENSE AMPLIFIERS AND ELECTRONIC SYSTEMS EMPLOYING THE SAME

(75) Inventor: Jin Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 174 days.

(21) Appl. No.: 12/289,650

(22) Filed: Oct. 31, 2008

(65) Prior Publication Data

US 2009/0129135 A1     May 21, 2009

(30) Foreign Application Priority Data

Nov. 19, 2007   (KR) .................. 10-2007-0117926

(51) Int. Cl.
    *G11C 5/02*      (2006.01)
(52) U.S. Cl. ............... 365/51; 365/205; 365/230.03
(58) Field of Classification Search ............ 365/51, 365/205, 230.03
    See application file for complete search history.

(56) References Cited

U.S. PATENT DOCUMENTS

| 2001/0009519 A1* | 7/2001 | Fujisawa et al. ............ 365/51 |
| 2003/0053327 A1* | 3/2003 | Kang et al. ............ 365/145 |
| 2006/0138466 A1 | 6/2006 | Choi |

FOREIGN PATENT DOCUMENTS

| JP | 2004-062997 | 2/2004 |
| KR | 10-0200760 | 3/1999 |
| KR | 10-2007-0041110 | 4/2007 |

* cited by examiner

*Primary Examiner* — Huan Hoang
(74) *Attorney, Agent, or Firm* — Harness, Dickey & Pierce, P.L.C.

(57) ABSTRACT

A semiconductor device having sense amplifiers and an electronic system employing the same are provided. The semiconductor device includes first sense amplifier blocks arranged in a row direction on a substrate and spaced apart from each other by a first distance. A second sense amplifier block spaced apart from the first sense amplifier blocks by a second distance greater than the first distance is provided. A plurality of cell array blocks arranged in the row direction on the substrate is provided. Each of the first and second sense amplifier blocks is disposed between the cell array blocks, and each of the cell array blocks includes a plurality of memory cells.

3 Claims, 6 Drawing Sheets

SEMICONDUCTOR DEVICES HAVING SENSE AMPLIFIERS AND ELECTRONIC SYSTEMS EMPLOYING THE SAME

PRIORITY STATEMENT

This non-provisional U.S. patent application claims priority under 35 U.S.C. §119 to Korean Patent Application No. 10-2007-0117926, filed on Nov. 19, 2007, the entire contents of which is incorporated herein by reference.

BACKGROUND

Description of Related Art

A conventional semiconductor memory device may be provided as an internal storage region of an electronic product including a computer. For example, conventional semiconductor devices such as DRAM may include a plurality of memory cells and a sense amplifier sensing and amplifying data of the memory cells.

SUMMARY

Example embodiments relate to semiconductor devices having sense amplifiers and electronic systems employing the same. Semiconductor devices according to example embodiments may include at least one sense amplifier laid out in a plurality of bit line pitches.

According to at least some example embodiments, a semiconductor device may include sense amplifiers. The semiconductor device may include first sense amplifier blocks arranged in a row direction on a substrate and spaced apart from each other by a first distance. A second sense amplifier block may be spaced apart from the first sense amplifier blocks by a second distance greater than the first distance. A plurality of cell array blocks may be arranged in the row direction on the substrate. Each of the first and second sense amplifier blocks may be disposed between the cell array blocks, and each of the cell array blocks may have a plurality of memory cells.

According to at least some example embodiments, each of the first and second sense amplifier blocks may include sense amplifiers arranged in a column direction. Bit line pairs may be connected to each of the sense amplifiers and to the same number of memory cells. Each of the sense amplifiers may be connected to 2×(N+1) cell array blocks by the bit line pairs. N may be a positive integer.

At least one other example embodiment provides that the cell array blocks may have the same width.

According to at least some example embodiments, a semiconductor device including sense amplifiers may be connected to a plurality of cell array blocks by a bit line pair. The semiconductor device may include main sense amplifier blocks arranged in a row direction on a substrate, spaced apart from each other, and configured to constitute a main sense amplifier group. Main cell array blocks may be arranged in the row direction on the substrate and spaced apart from each other. Main bit line pairs may be configured to connect 2×(N+1) main cell array blocks to each of the main sense amplifier blocks. Each of the main sense amplifier blocks may be disposed between the main cell array blocks. N may be a positive integer.

According to at least some example embodiments, each of the main sense amplifier blocks may include main sense amplifiers arranged in a column direction. The main sense amplifiers may be arranged in a zigzag formation.

At least one example embodiment provides that each of the main sense amplifiers may be laid out in every bit line pitch as many as the number of main sense amplifier blocks constituting the main sense amplifier group. Each of the main sense amplifier blocks may be disposed at the middle portion of the main bit line pair.

According to at least some example embodiments, the device may further include an edge sense amplifier group spaced apart from the main sense amplifier group, disposed at one side of the main sense amplifier group, arranged in a row direction on the substrate, and having edge sense amplifier blocks spaced apart from each other. At least one dummy cell array block may be disposed opposite to the main sense amplifier group with the edge sense amplifier group interposed therebetween. An edge bit line pair may be configured to connect N+1 main cell array blocks disposed in a direction of the main sense amplifier group to the edge sense amplifiers, the dummy cell array block and/or the main cell array block to the edge sense amplifiers.

A dummy bit line, disposed on a virtual extension line of an edge bit line, may be connected only to the main cell array block of the edge bit line pair. Furthermore, the dummy bit line may be connected to the dummy cell array block, wherein the dummy bit line may be spaced apart from the edge bit line pair.

At least one example embodiment provides that the device may further include an edge sense amplifier group spaced apart from the main sense amplifier group, disposed at one side of the main sense amplifier group and arranged in a row direction on the substrate. The edge sense amplifier group may have edge sense amplifier blocks spaced apart from each other. A dummy capacitor group may be disposed opposite to the main sense amplifier group with the edge sense amplifier group interposed therebetween. An edge bit line pair may be configured to connect N+1 main cell array blocks to the edge sense amplifiers, the dummy capacitor group to the edge sense amplifiers, and/or connect the main cell array block and the dummy capacitor group to the edge sense amplifiers.

According to at least some example embodiments, a sense amplifier less area provided between the main sense amplifier group and the adjacent main cell array blocks may be included.

At least one example embodiment provides that the main cell array blocks may include the same number of memory cells.

According to at least some example embodiments, each of the main cell array blocks may include a cell switching device and a cell data storage element.

At least some example embodiments provide that an electronic system employing a semiconductor device that may have sense amplifiers. The electronic system may include a processor, an input/output unit configured to perform data communication with the processor, and a semiconductor memory device configured to perform data communication with the processor. The semiconductor memory device may include first sense amplifier blocks arranged in a row direction on a substrate and spaced apart from each other by a first distance. A second sense amplifier block may be spaced apart from the first sense amplifier blocks by a second distance greater than the first distance. A plurality of cell array blocks may be arranged in a row direction on the substrate. Each of the first and second sense amplifier blocks may be disposed between the cell array blocks, and each of the cell array blocks may include a plurality of memory cells.

According to at least some example embodiments, each of the first and second sense amplifier blocks may include sense amplifiers arranged in a column direction. Bit line pairs may be connected to each of the sense amplifiers, wherein the bit line pairs may be connected to the same number of memory cells. Each of the sense amplifiers may be connected to 2×(N+1) cell array blocks by the bit line pairs. N may be a positive integer.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
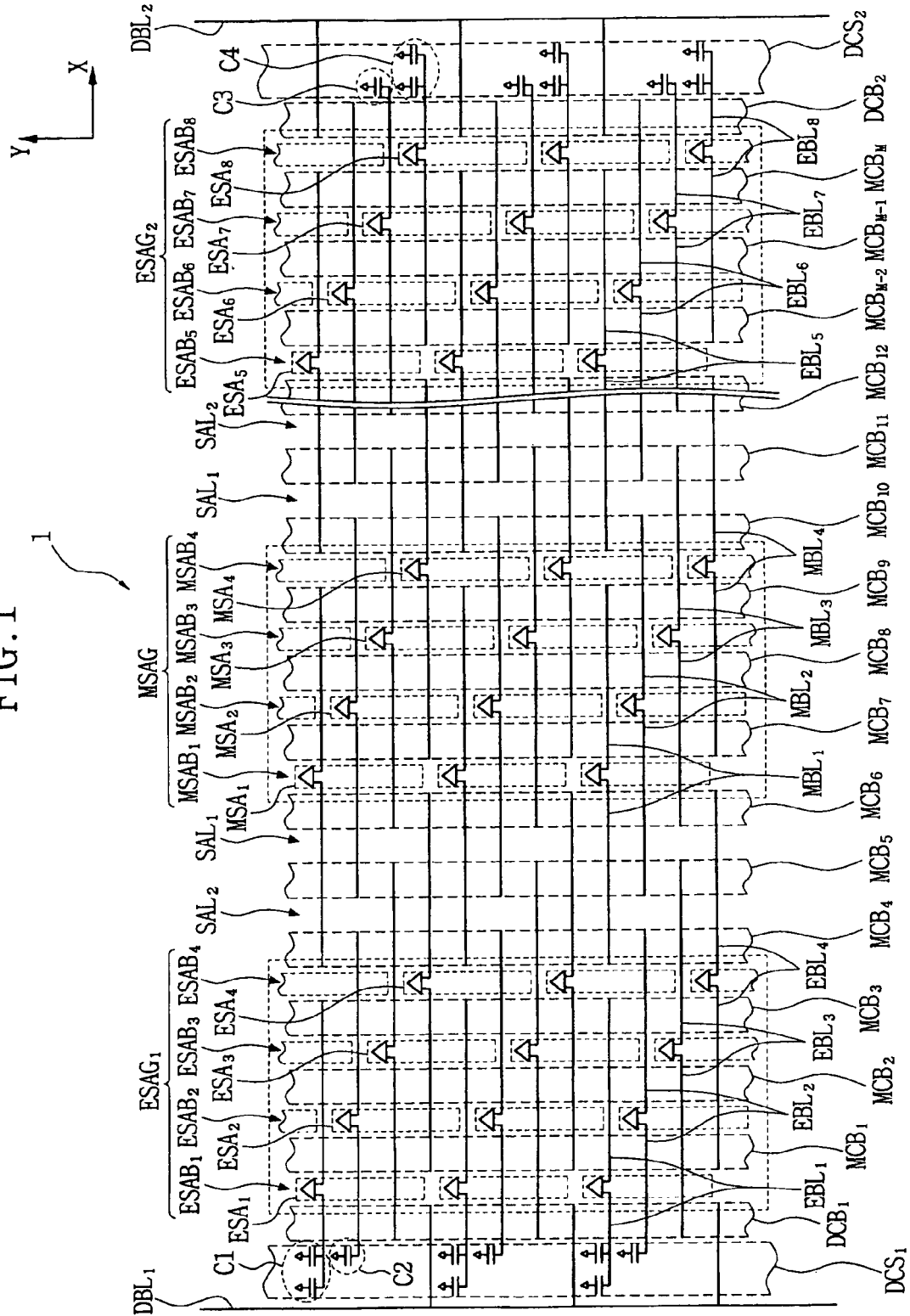
FIG. 1 illustrates a semiconductor device according to an example embodiment.

Various example embodiments will now be described more fully with reference to the accompanying drawings in which some example embodiments are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates a semiconductor device 1 according to an example embodiment. Referring to FIG. 1, the semiconductor device 1 may include M main cell array blocks $MCB_1$-$MCB_M$ arranged in a row direction X on a substrate. Here, M may be a positive integer. A plurality of memory cells may be provided in each of the main cell array blocks $MCB_1$-$MCB_M$. In the main cell array blocks $MCB_1$-$MCB_M$, the number of memory cells arranged in the row direction X may be substantially the same. Each of the memory cells may include a cell switching device and a cell data storage element. For example, in a case of a semiconductor memory device such as a DRAM, the cell data storage element may include a cell capacitor. The cell switching device may be an active device such as a MOS transistor or a diode.

A first dummy cell array block $DCB_1$ and a second dummy cell array block $DCB_2$ may be provided at both sides of the main cell array blocks $MCB_1$-$MCB_M$ with the main cell array blocks $MCB_1$-$MCB_M$ interposed therebetween. Each of the first and second dummy cell array blocks $DCB_1$ and $DCB_2$ may include a plurality of edge memory cells. The edge memory cells may have substantially similar components as the memory cells in the main cell array blocks $MCB_1$-$MCB_M$. Each of the first and second dummy cell array blocks $DCB_1$ and $DCB_2$ may also include a dummy cell capacitor and/or a dummy MOS capacitor.

At least one main sense amplifier group MSAG may be provided on the substrate. The main sense amplifier group MSAG may be arranged in the row direction on the substrate and include a plurality of main sense amplifier blocks $MSAB_1$-$MSAB_4$ spaced apart from each other. Each of the main sense amplifier blocks $MSAB_1$-$MSAB_4$ may include a corresponding plurality of main sense amplifiers $MSA_1$-$MSA_4$ arranged in a column direction Y. For example, FIG. 1 illustrates three of each of main sense amplifiers $MSA_1$-$MSA_4$.

Each of the main sense amplifiers $MSA_1$-$MSA_4$ may be connected to 2×(N+1) main cell array blocks by a corresponding main bit line pair $MBL_1$-$MBL_4$. The main sense amplifier $MSA_1$ may be connected to 2×(N+1) main cell array blocks by the bit line pair $MBL_1$. Also, each of the main sense amplifiers $MSA_1$-$MSA_4$ may be laid out in every two or more bit line pitches along the column direction Y. The main sense amplifier $MSA_1$ may be laid out in every two or more bit line pitches as many as the number of main sense amplifier blocks constituting one main sense amplifier group MSAG. For example, if there are four main sense amplifiers $MSA_1$-$MSA_4$, the main sense amplifier $MSA_1$ may be laid out in every fourth bit line pitch.

In FIG. 1, N may denote a positive integer of 2, and one MSAG may includes four main sense amplifier blocks, i.e., the first to fourth main sense amplifier blocks $MSAB_1$-$MSAB_4$. The first to fourth main sense amplifier blocks $MSAB_1$-$MSAB_4$ may be sequentially arranged along the row direction X.

Each of the main sense amplifier blocks $MSAB_1$-$MSAB_4$ may be provided between the main cell array blocks $MCB_1$-$MCB_M$. For example, as shown in FIG. 1, each of the main sense amplifier blocks $MSAB_1$-$MSAB_4$ may be provided between main cell array blocks $MCB_6$-$MCB_{10}$ selected from the main cell array blocks $MCB_1$-$MCB_M$. As illustrated in FIG. 1, when "N" denotes 2, the main sense amplifier group MSAG may include 4 main sense amplifier blocks, i.e., the first to fourth main sense amplifier blocks $MSAB_1$-$MSAB_4$, and each of the first to fourth main sense amplifier blocks $MSAB_1$-$MSAB_4$ may be connected to $2 \times (N+1)$ main cell blocks, i.e., 6 main cell array blocks, by a main bit line pair. For example, the first main sense amplifier block $MSAB_1$ may be connected to 6 main cell array blocks, i.e., the fourth to ninth main cell array blocks $MCB_4$-$MCB_9$, by a first main bit line pair $MBL_1$. Similarly, the second main sense amplifier block $MSAB_2$ may be connected to 6 main cell array blocks, i.e., the fifth to tenth main cell array blocks $MCB_5$-$MCB_{10}$ by a second main bit line pair $MBL_2$, the third main sense amplifier block $MSAB_3$ may be connected to 6 main cell array blocks, i.e., the sixth to eleventh main cell array blocks $MCB_6$-$MCB_{11}$ by a third main bit line pair $MBL_3$, and the fourth main sense amplifier block $MSAB_4$ may be connected to 6 main cell array blocks, i.e., the seventh to twelfth main cell array blocks $MCB_7$-$MCB_{12}$ by a fourth main bit line pair $MBL_4$.

The first main sense amplifier block $MSAB_1$ may include first main sense amplifiers $MSA_1$ arranged along the column direction Y and the second main sense amplifier block $MSAB_2$ may include second main sense amplifiers $MSA_2$ arranged along the column direction Y. In addition, the third main sense amplifier block $MSAB_3$ may include third main sense amplifiers $MSA_3$ arranged along the column direction Y, and the fourth main sense amplifier block $MSAB_4$ may include fourth main sense amplifiers $MSA_4$ arranged along the column direction Y.

A first edge sense amplifier group $ESAG_1$ spaced apart from the main sense amplifier group MSAG and disposed at one side of the main sense amplifier group MSAG may be provided. Similarly, a second edge sense amplifier group $ESAG_2$ disposed opposite to the first edge sense amplifier group $ESAG_1$ with the main sense amplifier group MSAG interposed therebetween may be provided. Each of the first and second edge sense amplifier groups $ESAG_1$ and $ESAG_2$ may include a plurality of edge sense amplifier blocks arranged in the row direction X and spaced apart from each other on the substrate. For example, the first edge sense amplifier group $ESAG_1$ may include first to fourth edge sense amplifier blocks $ESAB_1$-$ESAB_4$, and the second edge sense amplifier group $ESAG_2$ may include fifth to eighth edge sense amplifier blocks $ESAB_5$-$ESAB_8$. The first and eighth edge sense amplifier blocks $ESAB_1$ and $ESAB_8$, may be the farthest edge sense amplifier blocks from the main sense amplifier group MSAG and are respectively disposed between the first dummy cell array block $DCB_1$ and the main cell array block $MCB_1$, and between the second cell array block $DCB_2$ and the main cell array block $MCB_M$, as illustrated in FIG. 1. Also, the second to seventh edge sense amplifier blocks $ESAB_2$-$ESAB_7$ may be disposed between the main cell array blocks $MCB_1$-$MCB_M$, respectively. For example, the edge sense amplifier block $ESAB_2$ may be disposed between the main cell array block $MCB_1$ and the main cell array block $MCB_2$.

As illustrated in FIG. 1, like the main sense amplifier blocks $MSAB_1$-$MSAB_4$, the first to eighth edge sense amplifier blocks $ESAB_1$-$ESAB_8$ may include corresponding first to eighth sense amplifiers $ESA_1$-$ESA_8$.

Each of the first to eighth sense amplifiers $ESA_1$-$ESA_8$ may be connected to corresponding first to eighth edge bit line pairs $EBL_1$-$EBL_8$ including an edge bit line in the direction of the main sense amplifier group MSAG and an edge bit line in the opposite direction of the main sense amplifier group MSAG.

Each of the first to eighth sense amplifiers $ESA_1$-$ESA_8$ may be connected to N+1 main cell array blocks by the edge bit line in direction of the main sense amplifier group MSAG. In addition, each of the first to eighth sense amplifiers $ESA_1$-$ESA_8$ may be connected to the main cell array block and/or the dummy cell array blocks, $DCB_1$ and $DCB_2$ by its corresponding edge bit line pair $EBL_1$-$EBL_8$. For example, the third edge sense amplifier ESA3 may be connected. The dummy cell array block $DCB_1$ and the main sense amplifier group MSAG are disposed on opposite sides of the first edge sense amplifier group $ESAG_1$. The dummy cell array block $DCB_2$ and the main sense amplifier group MSAG are disposed on opposite sides of the second edge sense amplifier group $ESAG_2$. Sense amplifier less areas (SA_less area) $SAL_1$ and $SAL_2$, may be provided between the main sense amplifier group MSAG and the first edge sense amplifier group $ESAG_1$, and between the main sense amplifier group MSAG and the second edge sense amplifier group $ESAG_2$. Furthermore, when there is a plurality of main sense amplifier groups MSAG, the sense amplifier less areas may be provided between each of the main sense amplifier groups. Illustrated in FIG. 1, the first sense amplifier less areas $SAL_1$ may be provided between the fifth and sixth main cell array blocks $MCB_5$ and $MCB_6$, and between the tenth and eleventh main cell array blocks $MCB_{10}$ and $MCB_{11}$, which are disposed at both sides of the main sense amplifier group MSAG. Furthermore, the second sense amplifier less areas $SAL_2$ may be provided between the fourth and fifth main cell array blocks $MCB_4$ and $MCB_5$, and between the eleventh and twelfth main cell array blocks $MCB_{11}$ and $MCB_{12}$. In the example embodiment shown in FIG. 1, the sense amplifier less areas $SAL_1$ and $SAL_2$ may be defined as regions where sense amplifier blocks are not disposed between the main cell array blocks. Also, the main cell array blocks $MCB_1$-$MCB_M$ may have substantially the same number of memory cells and may be defined as regions where there are no disconnected bit line pairs. Therefore, the main cell array blocks $MCB_1$-$MCB_M$ may have substantially the same width.

The widths of the first and second sense amplifier less areas $SAL_1$ and $SAL_2$ may be flexibly designed. Therefore, the first and second sense amplifier less areas $SAL_1$ and $SAL_2$ may enable a semiconductor designer to flexibly design a layout of integrated circuits necessary for a semiconductor device. For example, it is possible to minimize the size of the first and second sense amplifier less areas $SAL_1$ and $SAL_2$, and to thereby increase other areas. In addition, the first and second sense amplifier less areas $SAL_1$ and $SAL_2$ may provide a space to the semiconductor designer, so that the designer may design an integrated circuit capable of optimizing the performance of the semiconductor device in the first and second sense amplifier less areas $SAL_1$ and $SAL_2$.

Meanwhile, a first dummy capacitor structure $DCS_1$ may be disposed opposite the first edge sense amplifier group $ESAG_1$ with the first dummy cell array block $DCB_1$ interposed therebetween. Also, a second dummy capacitor structure $DCS_2$ may be disposed opposite the second edge sense amplifier group $ESAG_2$ with the second dummy cell array block $DCB_2$ interposed therebetween. More specifically, the bit line of the first edge bit line pair $EBL_1$ that is disposed in the direction of the main sense amplifier group MSAG may be connected to the first to third main cell array blocks $MCB_1$-$MCB_3$, and the other bit line of the first edge bit line pair $EBL_1$ may be connected to the first dummy cell array block $DCB_1$ and a first dummy capacitor C1 of the first dummy capacitor structure $DCS_1$. When capacitors of the first dummy cell array block $DCB_1$ connected to the first edge bit line pair $EBL_1$ have the same capacitance as capacitors of one main cell array block connected to the first edge bit line pair $EBL_1$, the first dummy capacitor C1 may have a capacitance corresponding to the other two blocks of the first to third main cell array blocks $MCB_1$-$MCB_3$. Similarly, the bit line of the second edge bit line pair $EBL_2$ that is disposed in the direction of the main sense amplifier group MSAG may be connected to the second to fourth main cell array blocks $MCB_2$-$MCB_4$, and the other bit line of the bit line pair $EBL_2$ may be connected to the first main cell array block $MCB_1$, the first dummy cell array block $DCB_1$ and a second dummy capacitor C2 of the first dummy capacitor structure $DCS_1$. The second dummy capacitor C2 may have a capacitance corresponding to one block of the second to fourth cell array blocks $MCB_2$-$MCB_4$. While each of the first and second dummy capacitors C1 and C2 may include a cell capacitor and/or a MOS capacitor including a lower electrode, a dielectric layer and an upper electrode, as disclosed in Korean Patent Registration No. KR-10-0575005, the first and second dummy capacitors C1 and C2 may have different capacitances. The first and second dummy capacitors C1 and C2 may constitute the first dummy capacitor structure $DCS_1$. Similarly, the third and fourth dummy capacitors C3 and C4 which may be disposed opposite the second edge sense amplifier group $ESAG_2$ with the second dummy cell array block $DCB_2$ interposed therebetween. The third and fourth dummy capacitors C3 and C4 may have different capacitances. The third and fourth dummy capacitors C3 and C4 may constitute the second dummy capacitor structure $DCS_2$. Therefore, a capacitance of one side may be the same as that of the other side with respect to the first to fourth sense amplifiers $ESA_1$-$ESA_4$, and the fifth to eighth sense amplifiers $ESA_5$-$ESA_8$, respectively, by the first and second dummy capacitor structures $DCS_1$ and $DCS_2$.

At least one other example embodiment provides that the first and second dummy cell array blocks $DCB_1$ and $DCB_2$ may be omitted. In each of the first and second dummy capacitor structures $DCS_1$ and $DCS_2$, another dummy capacitor may be laid out in an edge bit line pair selected among the first to fourth edge bit line pairs $EBL_1$-$EBL_4$, and the fifth to eighth edge bit line pairs $EBL_5$-$EBL_8$. The newly disposed dummy capacitor may have a capacitance corresponding to the omitted first and second dummy cell array blocks $DCB_1$ and $DCB_2$.

The second main sense amplifier block $MSAB_2$ laid out between the seventh and eighth main cell array blocks $MCB_7$ and $MCB_8$ among the above-described main cell array blocks $MCB_1$-$MCB_M$ will be described below with reference to FIG. 2.

Figure 2:
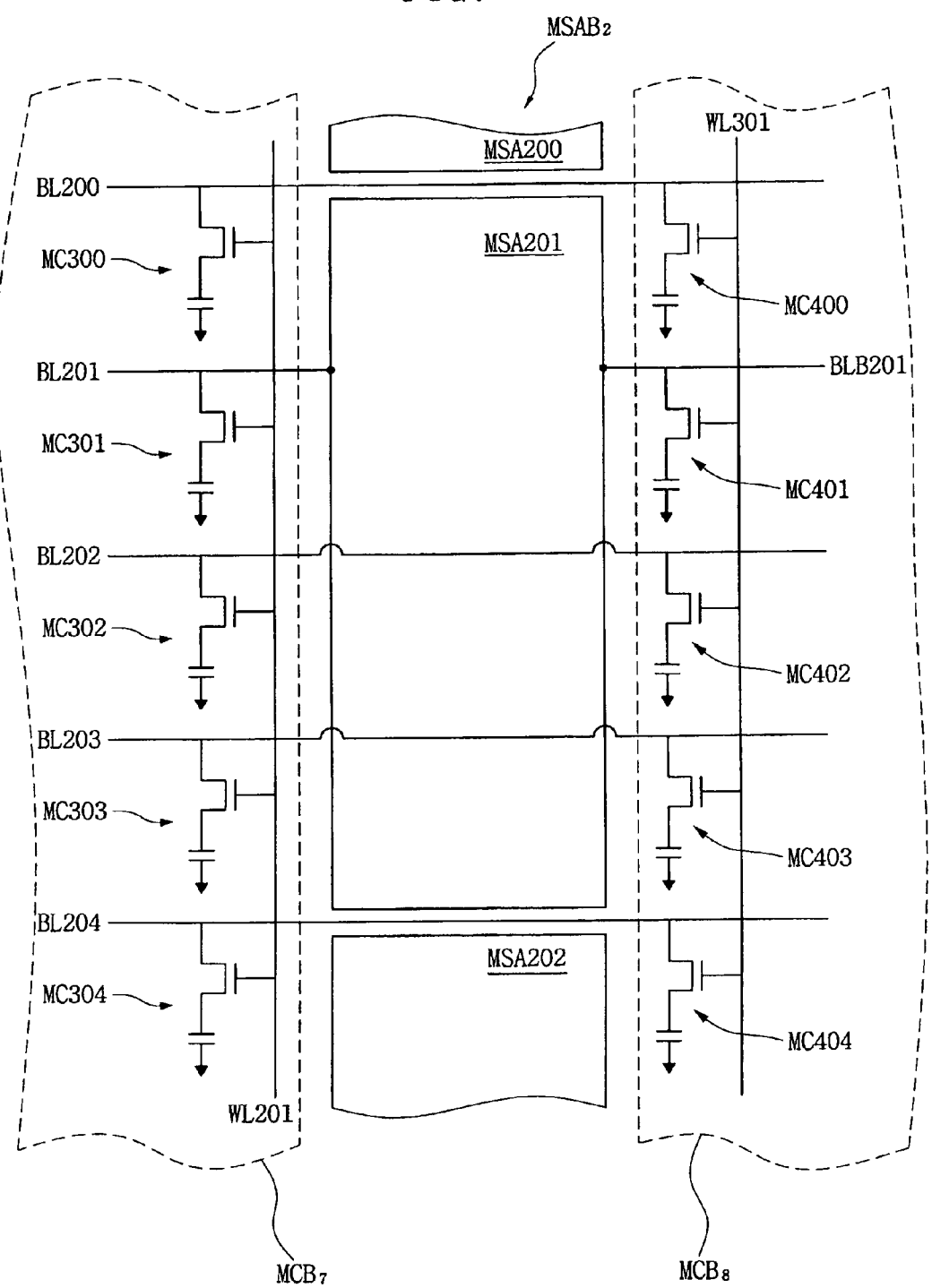
FIG. 2 is a circuit diagram of a semiconductor device according to an example embodiment.

Referring to FIG. 2, the second main sense amplifier block $MSAB_2$ may include second main sense amplifiers MSA200, MSA201 and MSA202 arranged in the column direction Y. Also, a plurality of main bit lines BL200-BL204 may be disposed across the seventh and eighth main cell array blocks $MCB_7$ and $MCB_8$. The second main sense amplifier MSA 201 may be laid out to be connected to one bit line pair BL201 and BLB201 and the other main bit lines BL202 and BL203 may be laid out to cross over the second main sense amplifier MSA201. However, it should be understood that any second main sense amplifier may be connected to a bit line pair.

Word lines WL201 and WL301 may be disposed across the seventh and eighth main cell array blocks $MCB_7$ and $MCB_8$, respectively, and crossing the main bit lines BL200-BL204. A plurality of main cells MC300-MC304 may be laid out in the seventh main cell array block $MCB_7$, and a plurality of main cells MC400-MC404 may be laid out in the eighth main cell array block $MCB_8$. Each of the main cells MC300-MC404 may have a MOS transistor as a cell switching device and a cell capacitor as a cell memory storage device.

Each of the main sense amplifiers may be laid out in every two or more bit line pitches as many as the number of main sense amplifier blocks constituting the main sense amplifier group MSAG. For example, when the first to fourth main sense amplifier blocks $MSAB_1$-$MSAB_4$ are arranged in the row direction X in one main sense amplifier group MSAG, each of the first to fourth main sense amplifiers $MSA_1$-$MSA_4$ may be laid out in every four bit line pitches in the column direction Y.

As described above, since the sense amplifier may be laid out in every two or more bit line pitches, a transistor constituting the sense amplifier can ensure the broad channel width. Accordingly, since an area large enough to lay out the sense amplifier is ensured, a reliable sense amplifier can be provided.

Figure 3:
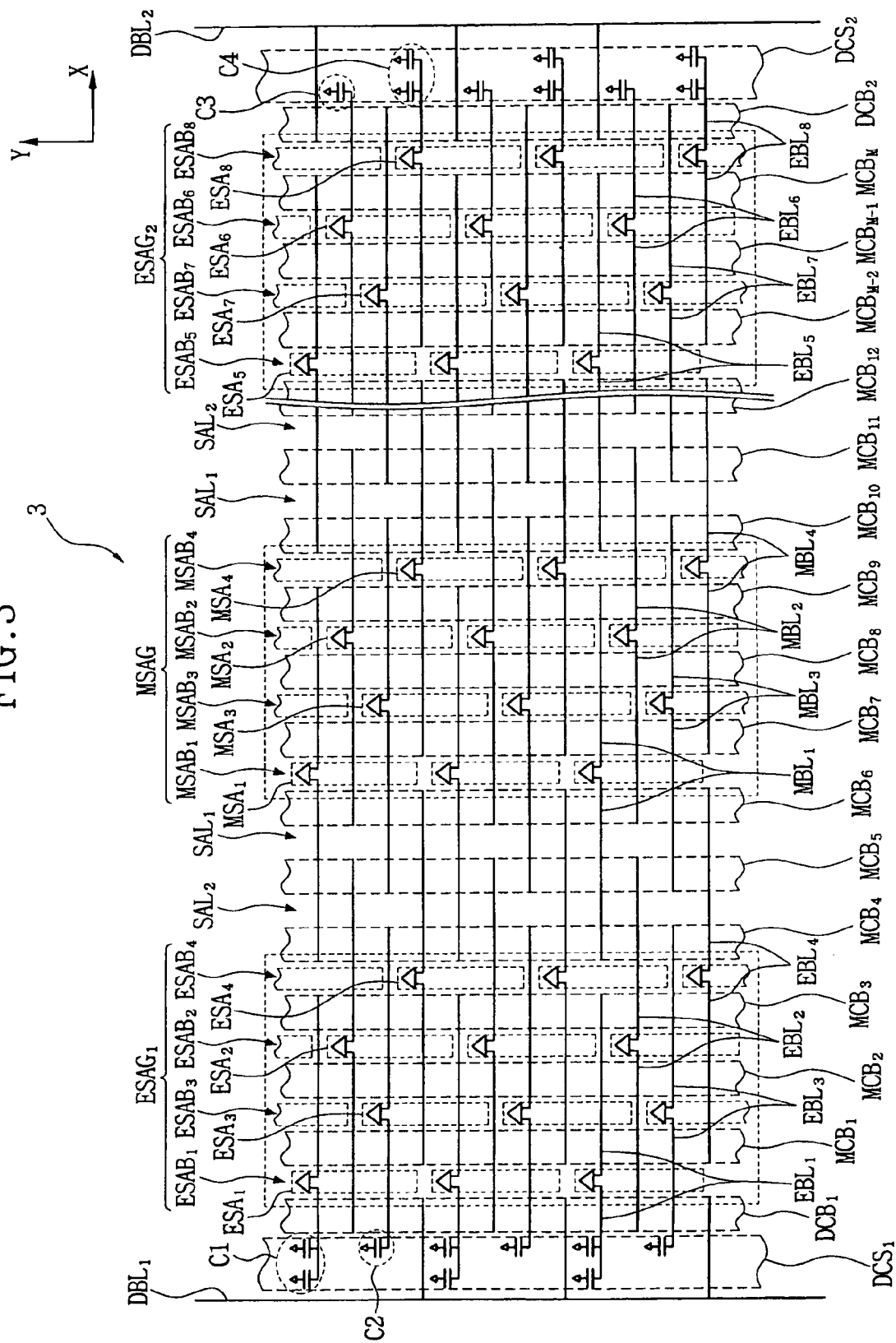
FIGS. 3-5 illustrate semiconductor devices according to other example embodiments.

FIG. 3 illustrates a semiconductor device 3 according to another example embodiment. FIG. 3 is a layout illustrating that the locations of the second main sense amplifier block $MSAB_2$ and the third main sense amplifier block $MSAB_3$ of FIG. 1 may be changed. Also, the changed location of the second main sense amplifier block $MSAB_2$ of FIG. 1 to that of the third main sense amplifier block $MSAB_3$ of FIG. 1 may cause the locations of the third edge sense amplifier block $ESAB_3$ of FIG. 1 and the second edge sense amplifier block $ESAB_2$ of FIG. 1 to be changeable and the locations of the sixth edge sense amplifier block $ESAB_6$ of FIG. 1 and the seventh edge sense amplifier block $ESAB_7$ to be changeable. As a result of changing the locations of the second main sense amplifier block $MSAB_2$ and the third main sense amplifier block $MSAB_3$ of FIG. 1, locations of the second and fourth dummy capacitors C2 and C4 of FIG. 1 constituting the first and second dummy capacitor structures $DCS_1$ and $DCS_2$ may be changed to be laid out as illustrated in FIG. 3. As described above, since changing the locations of the second and fourth dummy capacitors C2 and C4 in the example embodiments of FIG. 3 is substantially similar as laying out the second and fourth dummy capacitors C2 and C4 in FIG. 1, the detailed descriptions thereof will be omitted for the sake of brevity and clarity.

In addition, while not shown, the locations of the first and second main sense amplifier blocks $MSAB_1$ and $MSAB_2$ of FIG. 1 may be changed. Similarly, the locations of the first and third main sense amplifier blocks $MSAB_1$ and $MSAB_3$ may be changed or the locations of the first and fourth main sense amplifier blocks $MSAB_1$ and $MSAB_4$ may be changed. In this case, when blocks selected from the first to fourth main sense amplifier blocks $MSAB_1$-$MSAB_4$ change their locations to be laid out, the locations of the first to fourth edge sense amplifier blocks $ESAB_1$-$ESAB_4$ and the fifth to eighth edge sense amplifier blocks $ESAB_5$-$ESAB_8$ may be appropriately changed to be laid out. Even though the locations of the main sense amplifier blocks of FIG. 1 may be changed to be laid out, the sense amplifier less areas SAL1 and SAL2 substantially similar to that of FIG. 1 may be provided. In addition, the first to fourth main sense amplifiers $MSA_1$-$MSA_4$ may be laid out in every four bit line pitches in the column direction Y as described above.

Figure 4:
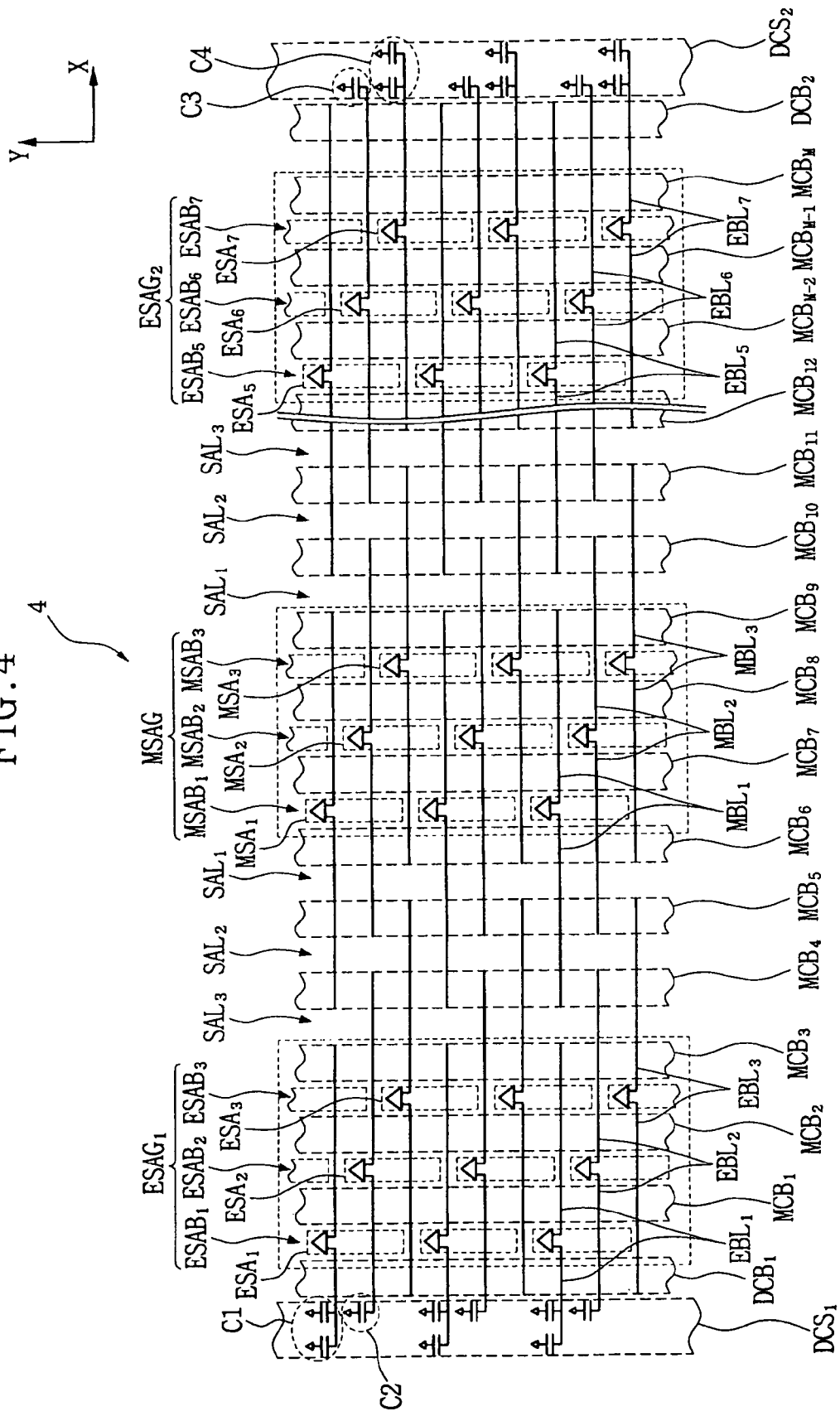

FIG. 4 illustrates a semiconductor device 4 according to another example embodiment.

The number of main sense amplifiers constituting one main sense amplifier group MSAG may be adjusted. For example, while the first to fourth main sense amplifier blocks $MSAB_1$-$MSAB_4$ may be sequentially arranged in FIG. 1, one of the first to fourth main sense amplifier blocks $MSAB_1$-$MSAB_4$ may be omitted as shown in FIG. 4. FIG. 1 illustrates that one main sense amplifier group MSAG may include four main sense amplifier blocks, and FIG. 4 illustrates that one main sense amplifier group MSAG may include three main sense amplifier blocks. In FIG. 4, the fourth main sense amplifier block $MSAB_4$ may be omitted among the first to fourth main sense amplifier blocks $MSAB_1$-$MSAB_4$ of FIG. 1. The omitted fourth main sense amplifier block $MSAB_4$ may cause the fourth edge sense amplifier block $ESAB_4$ and the eighth edge sense amplifier block $ESAB_8$ to be omitted as well. Furthermore, as illustrated in FIG. 4, the first and second dummy bit lines $DBL_1$ and $DBL_2$ may be omitted. As described above, even though the fourth main sense amplifier block $MSAB_4$, the fourth edge sense amplifier block $ESAB_4$, the eighth edge sense amplifier block $ESAB_8$, and the first and second dummy bit lines $DBL_1$ and $DBL_2$ of FIG. 1 may be omitted, the sense amplifier less areas $SAL_1$ and $SAL_2$ and an additional sense amplifier less area $SAL_3$, may be provided between the memory cell blocks laid out at both sides of the main sense amplifier groups MSAG. The number of sense amplifier less areas may be adjusted depending on the number of main sense amplifier blocks constituting the main sense amplifier group MSAG and the number of "N".

Figure 5:
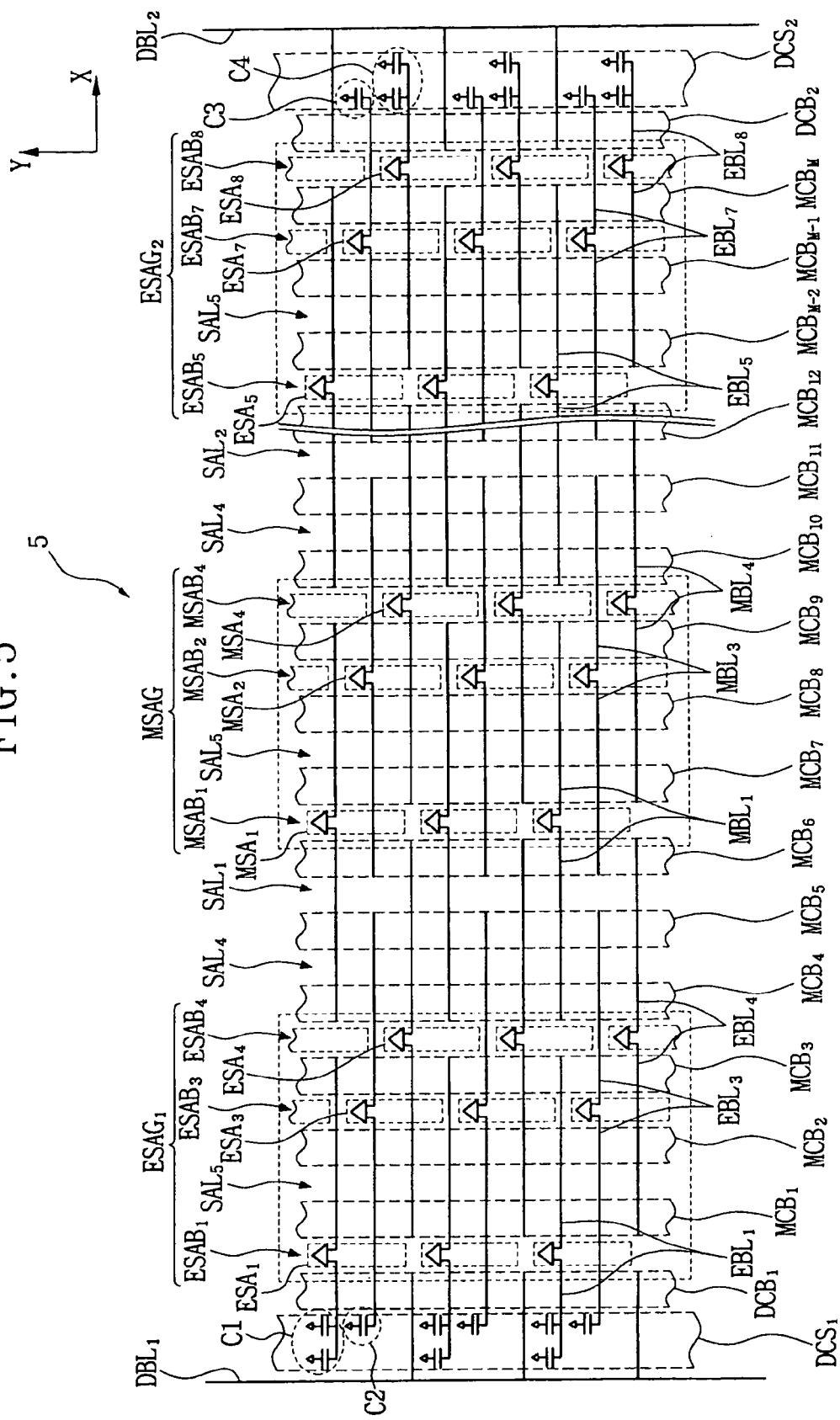

FIG. 5 illustrates a semiconductor device 5 according to another example embodiment. In FIG. 5, the second edge sense amplifier block $ESAB_2$, the second main sense amplifier block $MSAB_2$ and the seventh edge sense amplifier block $ESAB_7$ of FIG. 1 may be omitted. As a result of omitting the second edge sense amplifier block $ESAB_2$, the second main sense amplifier block $MSAB_2$ and the seventh edge sense amplifier block $ESAB_7$, a fifth sense amplifier less areas $SAL_5$ may be provided within the first edge sense amplifier group $ESAG_1$, the main sense amplifier group MSAG and the second edge sense amplifier group $ESAG_2$. In an alternative embodiment, the fifth sense amplifier less areas $SAL_5$ may be omitted so that main cell array blocks at both sides of the fifth sense amplifier less areas $SAL_5$ may be laid out like one cell array block.

Figure 6:
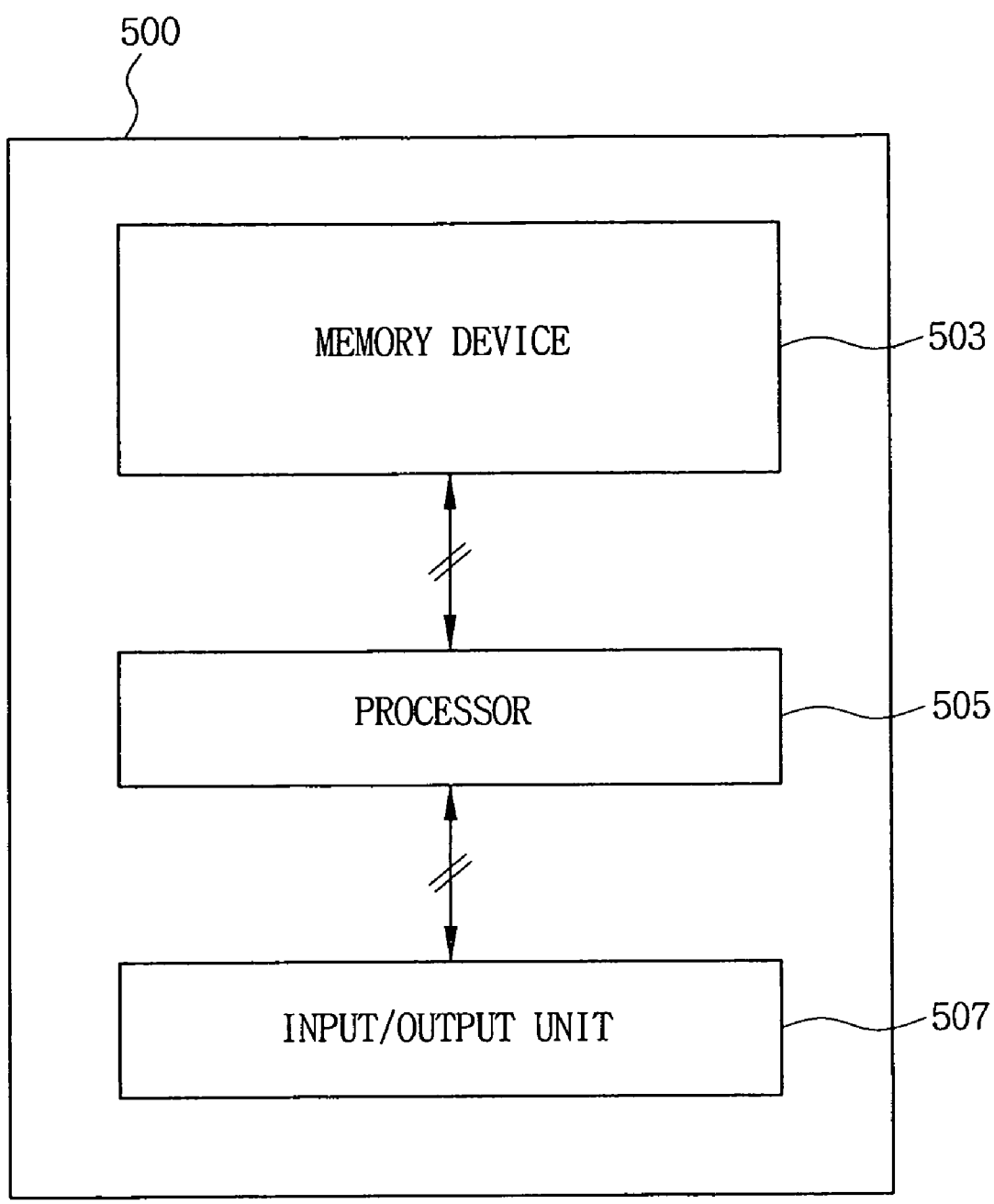
FIG. 6 is a schematic block diagram of an electronic system according to an example embodiment.

FIG. 6 is a schematic block diagram of an electronic product employing a semiconductor device according to example embodiments.

Referring to FIG. 6, the electronic product 500 includes at least one memory device 503 for storing data and a processor 505 connected to the memory device 503. The memory device 503 may be the semiconductor device according to example embodiments. The electronic product 500 may exchange data with other electronic systems such as personal computers or computer networks through an input/output unit 507. The input/output unit 507 may provide data through a peripheral bus line of a computer, a high-speed digital transmission line or a wireless transmission/reception antenna. The data communication between the processor 505 and the memory device 503, and the data communication between the processor 505 and the input/output unit 507 may be performed using general bus architectures.

According to example embodiments, one sense amplifier can be laid out in a plurality of bit line pitches, and thus design rules of a sense amplifier can be flexible. Also, since an area large enough to dispose the sense amplifier can be ensured, the channel width of a transistor constituting the sense amplifier can be increased. Therefore, a reliable sense amplifier can be provided.

While example embodiments have been described with reference to the example embodiments shown in the figures, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor device comprising:
a main sense amplifier group including main sense amplifier blocks arranged in a row direction on a substrate and spaced apart from each other;
main cell array blocks arranged in the row direction on the substrate and spaced apart from each other;
main bit line pairs configured to couple 2×(N+1) main cell array blocks to each of the main sense amplifier blocks, each of the main sense amplifier blocks being disposed between the main cell array blocks and N is a positive integer;
an edge sense amplifier group spaced apart from the main sense amplifier group, disposed at one side of the main sense amplifier group and arranged on the substrate, the edge sense amplifier group having edge sense amplifier blocks arranged in a row direction and spaced apart from each other and the edge sense amplifier blocks having edge sense amplifiers;
at least one dummy cell array block disposed on a side of the edge sense amplifier group, the edge sense amplifier group being interposed between the at least one dummy cell array block and the main sense amplifier group; and
an edge bit line pair configured to couple at least one of N+1 main cell array blocks, the at least one dummy cell array block to at least one edge sense amplifier, at least one main cell array block to at least one edge sense amplifier, and the dummy cell array block to at least one edge sense amplifier.

2. The device of claim 1, further comprising:
a dummy bit line disposed on a virtual extension line of an edge bit line coupled to the main cell array block of the edge bit line pair, and configured to couple the dummy cell array block, wherein the dummy bit line is spaced apart from the edge bit line pair.

3. A semiconductor device comprising:
a main sense amplifier group including main sense amplifier blocks arranged in a row direction on a substrate and spaced apart from each other;
main cell array blocks arranged in the row direction on the substrate and spaced apart from each other;
main bit line pairs configured to couple 2×(N+1) main cell array blocks to each of the main sense amplifier blocks, each of the main sense amplifier blocks being disposed between the main cell array blocks and N is a positive integer;
an edge sense amplifier group spaced apart from the main sense amplifier group, disposed at one side of the main sense amplifier group and arranged in a row direction on the substrate, the edge sense group having edge sense amplifier blocks spaced apart from each other and the edge sense amplifier blocks having edge sense amplifiers;

at least one dummy capacitor group disposed on a side of the edge sense amplifier group, the edge sense amplifier group being interposed between the at least one dummy capacitor group; and an edge bit line pair configured to couple at least one of N+1 main cell array blocks, the at least one dummy capacitor group to at least one edge sense amplifier, and the main cell array block to at least one edge sense amplifier.

* * * * *